United States Patent [19]
Mehta et al.

[11] 3,959,781
[45] May 25, 1976

[54] SEMICONDUCTOR RANDOM ACCESS MEMORY

[75] Inventors: Rustam J. Mehta, Sunnyvale; Michael Geilhufe, Los Gatos, both of Calif.

[73] Assignee: Intel Corporation, Santa Clara, Calif.

[22] Filed: Nov. 4, 1974

[21] Appl. No.: 520,797

[52] U.S. Cl............................ 340/173 R; 307/238; 307/279
[51] Int. Cl.².......................................... G11C 11/40
[58] Field of Search................. 340/173 R; 307/238, 307/279

[56] References Cited
UNITED STATES PATENTS

| | | | |
|---|---|---|---|
| 3,387,286 | 6/1968 | Dennard | 340/173 R |
| 3,699,537 | 10/1972 | Wahlstrom | 340/173 R |

Primary Examiner—Terrell W. Fears

[57] ABSTRACT

A random access memory system employing dynamic storage wherein each cell comprises a single active element. The memory employs MOS technology and is disposed on a silicon substrate. A plurality of sense amplifiers are disposed in a column substantially bisecting each row of memory cells in the memory array. A single input/output line communicates with all the cells. Two dummy cells are employed on each row line on opposite sides of the sense amplifiers. The value of the signal provided by the dummy cell is approximately mid-way between a "0" signal and a "1" signal provided by the storage cells. A plurality of timing signals are generated within the memory; accurate timing is obtained by utilizing the output of one timing generator to trigger or initiate the generation of a signal in another generator.

19 Claims, 11 Drawing Figures

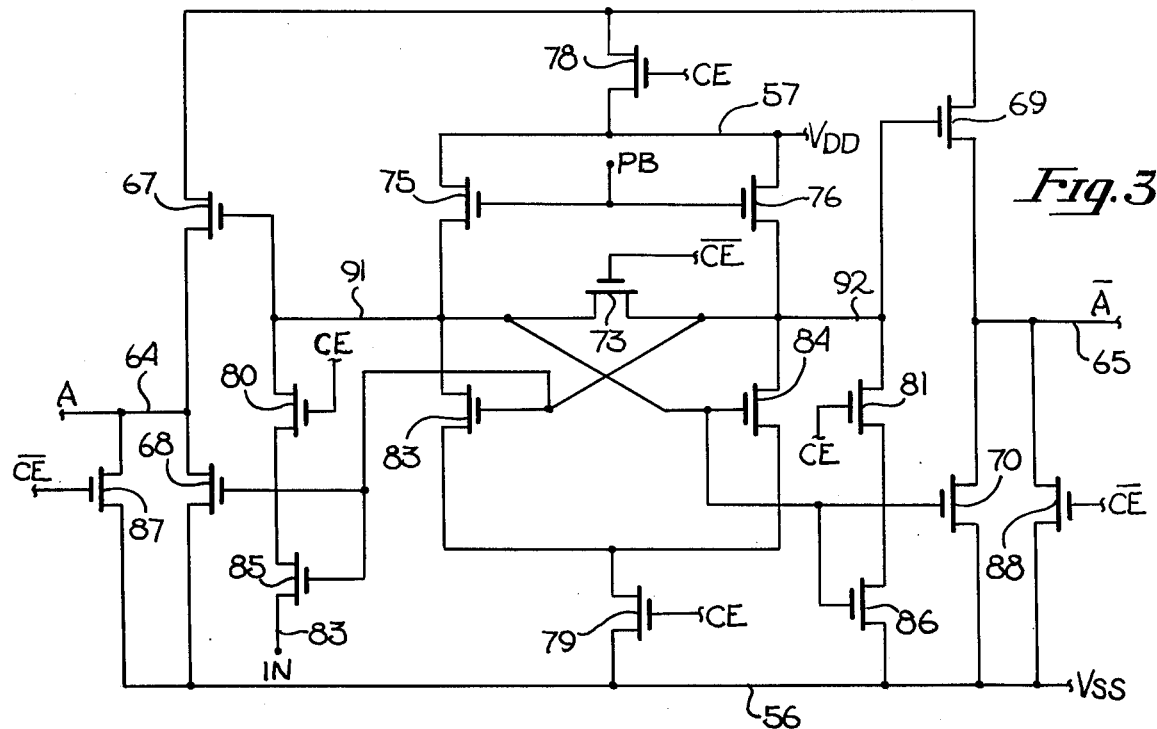
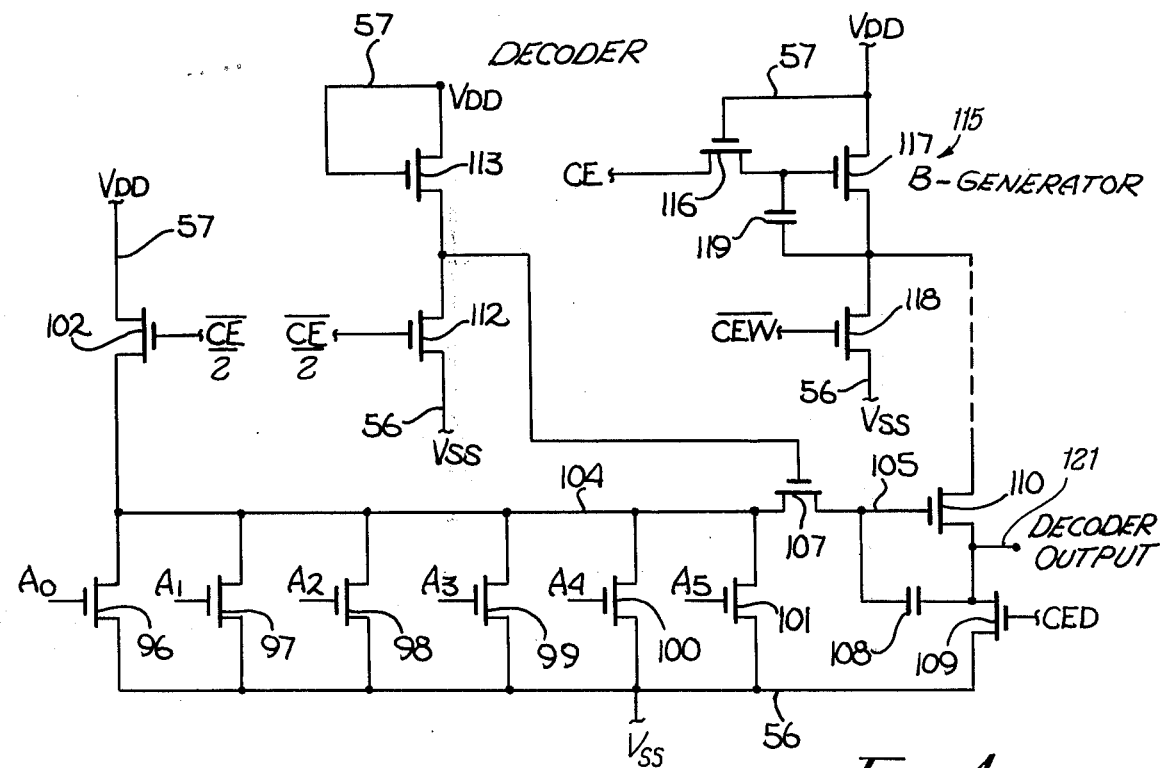

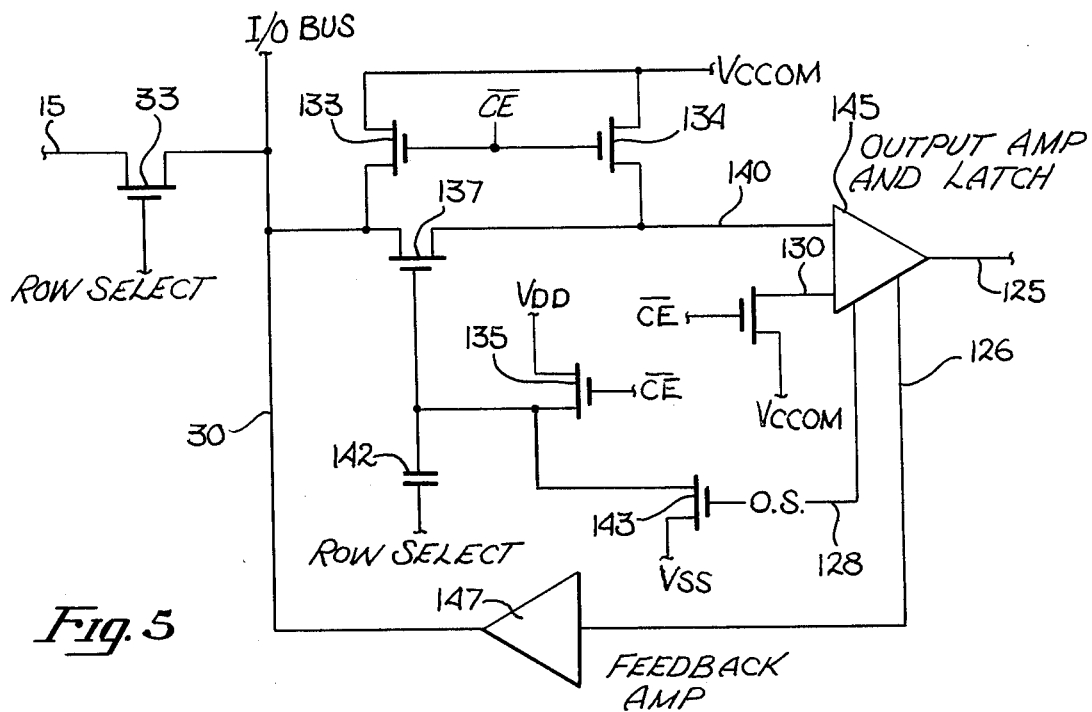
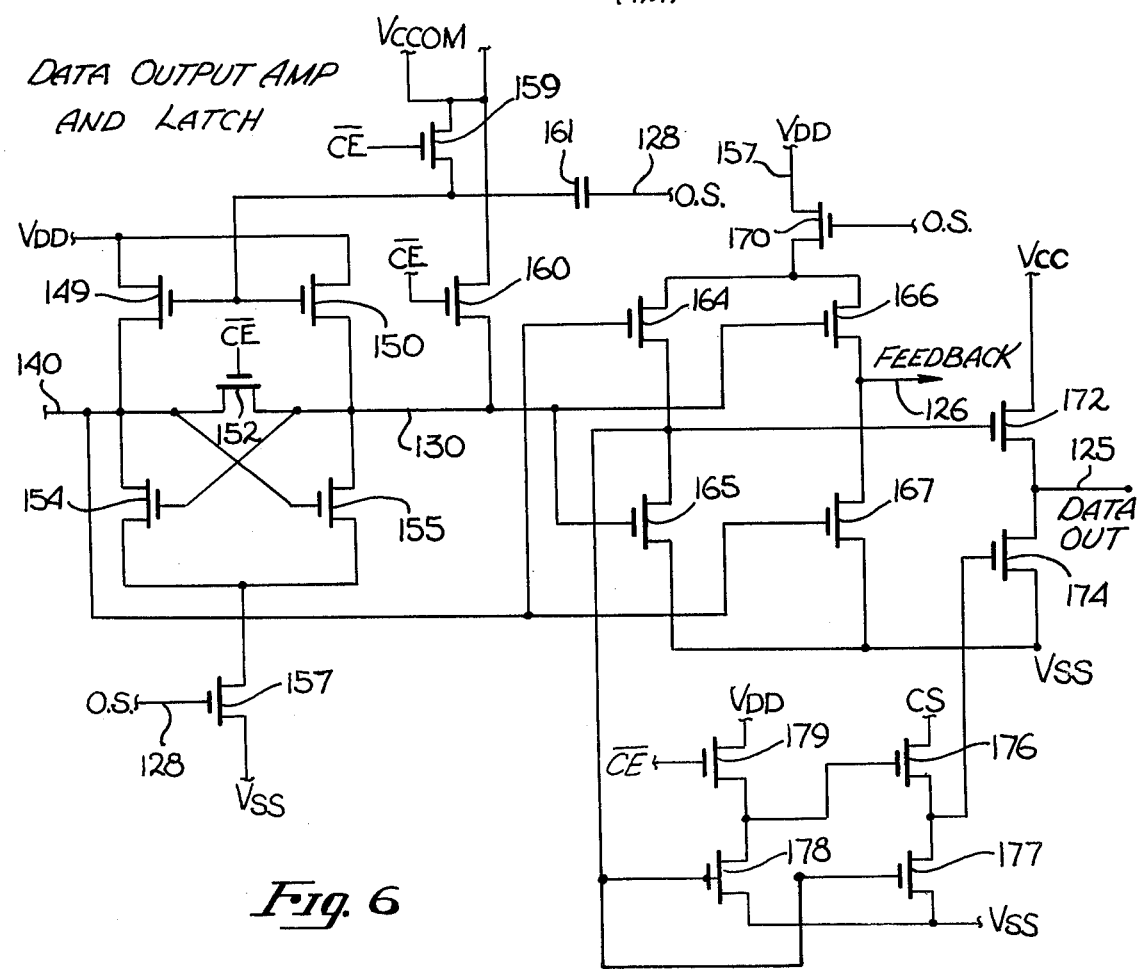

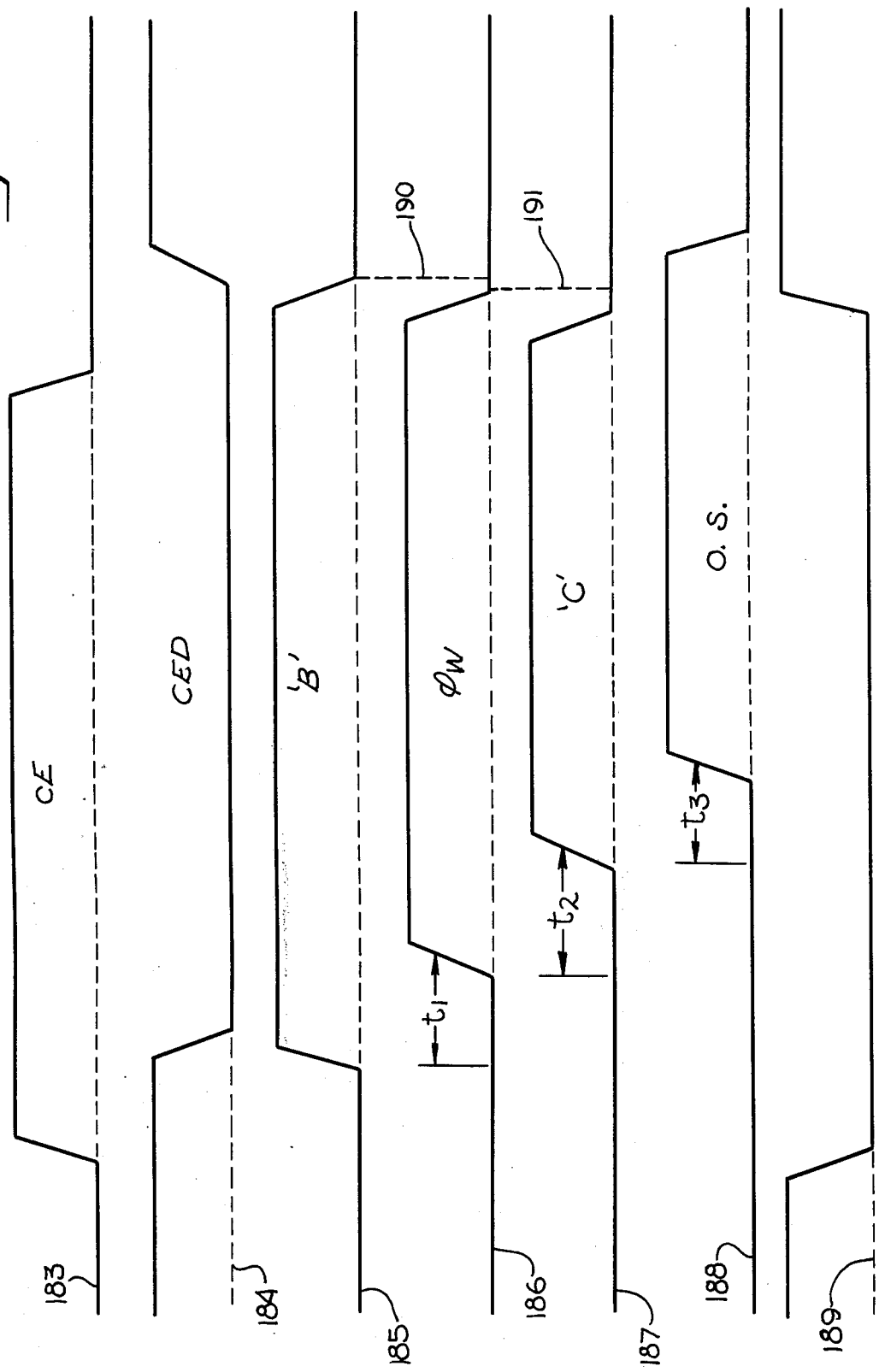

SEMICONDUCTOR RANDOM ACCESS MEMORY

BACKGROUND OF THE INVENTION

1. Field of the Invention

The invention relates to the field of semiconductor random access memories.

2. Prior Art

Semiconductor memories including random access memories (RAMs), read-only-memories (ROMs), programmable read-only-memories (PROMs) are known in the prior art. These memories have been fabricated in the prior art utilizing MOS technology wherein an entire memory is fabricated on a single silicon substrate. It is a characteristic of such fabrication that production yields are substantially unaffected by the density of devices. Thus, for a fixed area of substrate it is desirable to provide as many memory cells as possible in order to obtain the lowest costs per bit of storage.

In semiconductor MOS RAM's cells are either static or dynamic. The static type of cells generally include bistable circuits such as flip-flops which once set in a particular set, remain in that state. Such circuits require a number of devices, for example, several field effect transistors are required in a flip-flop. The dynamic memory cells typically employ capacitive storage but since such storage is transient, refreshing is required. The capacitive storage means used in the prior art include the gates of field effect transistors, junction capacitance, etc. Examples of such dynamic prior art cells are shown in U.S. Pat. Nos. 3,593,037 and 3,706,079.

In order to obtain the high densities, the present invention utilizes memory cells employing only a single active device. This device is a field effect transistor which is used to gate or select a capacitive storage means. Such single device cells utilizing field effect transitors have been known in the prior art. For example, see U.S. Pat. No. 3,387,286. Another so-called "one device per bit" capacitive storage memory array utilizing field effect transistors is shown in U.S. Pat. No. 3,699,537. Other prior art is shown in U.S. Pat. No. 3,533,089 and 3,514,765. The present invention utilizes the single active device per cell concept in a unique manner to provide a practical memory system.

SUMMARY OF THE INVENTION

An MOS, dynamic storage, random access memory is described wherein each memory cell employs a single field effect transistor and a capacitive storage means comprising an MOS device having its source and drain coupled together. In the presently preferred n-channel embodiment, the gate of the capacitive storage means is coupled to a positive potential. The presently preferred embodiment includes a 64 × 64 array with 64 sense amplifiers disposed in a column substantially bisecting each of the row lines. A single input/output bus is employed and is disposed along one side of the array. The input/output bus communicates with the cells disposed on the opposite sides of the array through the sense amplifiers. A pair of dummy cells, each of which includes a constant capacitance, are connected to each of the row lines on opposite sides of the sense amplifiers. The dummy cell on the unselected half of the selected row line reads a signal approximately between a 0 and a 1 onto the row line during reading and refreshing.

Various decoupling circuits are utilized to mitigate the effects of the high capacitance associated with the input/output bus including the use of a positive feedback circuit connecting the output amplifier with the input/out bus. A number of unique circuits are utilized to obtain a fast access time, including a decoupling circuit for decoupling capacitance in the decoders and a bootstrap circuit which is used to boost the potential on the gate of an output transistor, but which is substantially independent of the capacitance associated with the load on the output transistor.

A plurality of timing signals are generated by the memory system, including several signals which are used to limit the consumption of power. Several of these signals are delayed one from the other in time. This delay is obtained in part by using the output from one generator to initiate an action in another generator in a "chain reaction" scheme which assures accurate timing. The chain reaction is initiated when the memory has received a chip enable. Thus, automatic compensation is obtained for delays associated with process parameters.

BRIEF DESCRIPTION OF THE DRAWINGS

FIG. 3 is a circuit diagram of the address buffer and latch utilized in the invented memory.

FIG. 4 is a circuit diagram of a decoder and B generator employed in the invented memory.

FIG. 5 is a circuit diagram illustrating the data output feedback and decoupling means used in conjunction with the input/output bus of the invented memory.

FIG. 6 is a circuit diagram of the data output amplifier and latch shown in block diagram form in FIG. 5.

FIG. 11 is a graph illustrating several waveforms associated with the operation of the memory shown in FIG. 1.

DETAILED DESCRIPTION OF THE INVENTION

The random access memory of the present invention in its presently preferred embodiment is fabricated as a 4,096 bit memory in a 64 × 64 array. It will be appreciated that the size of the array and many other specific details disclosed in this application, such as specific voltages, are not critical to the invention but are disclosed in order that a full understanding of the memory system may be obtained. In the presently preferred embodiment the entire memory including the memory cells and peripheral circuits are disposed on a single silicon substrate and fabricated utilizing known MOS technology. The transistors utilized as part of the memory are field effect transistors, and for the presently preferred embodiment are n-channel field effect transistors employing polycrystalline silicon gates. The disclosed memory which is substantially TTL compatible, has an access time of approximately 250 nanoseconds. Operating power for the memory array is approximately 400 milliwatts, and the memory requires approximately 2 milliwatts during standby.

Figure 1:
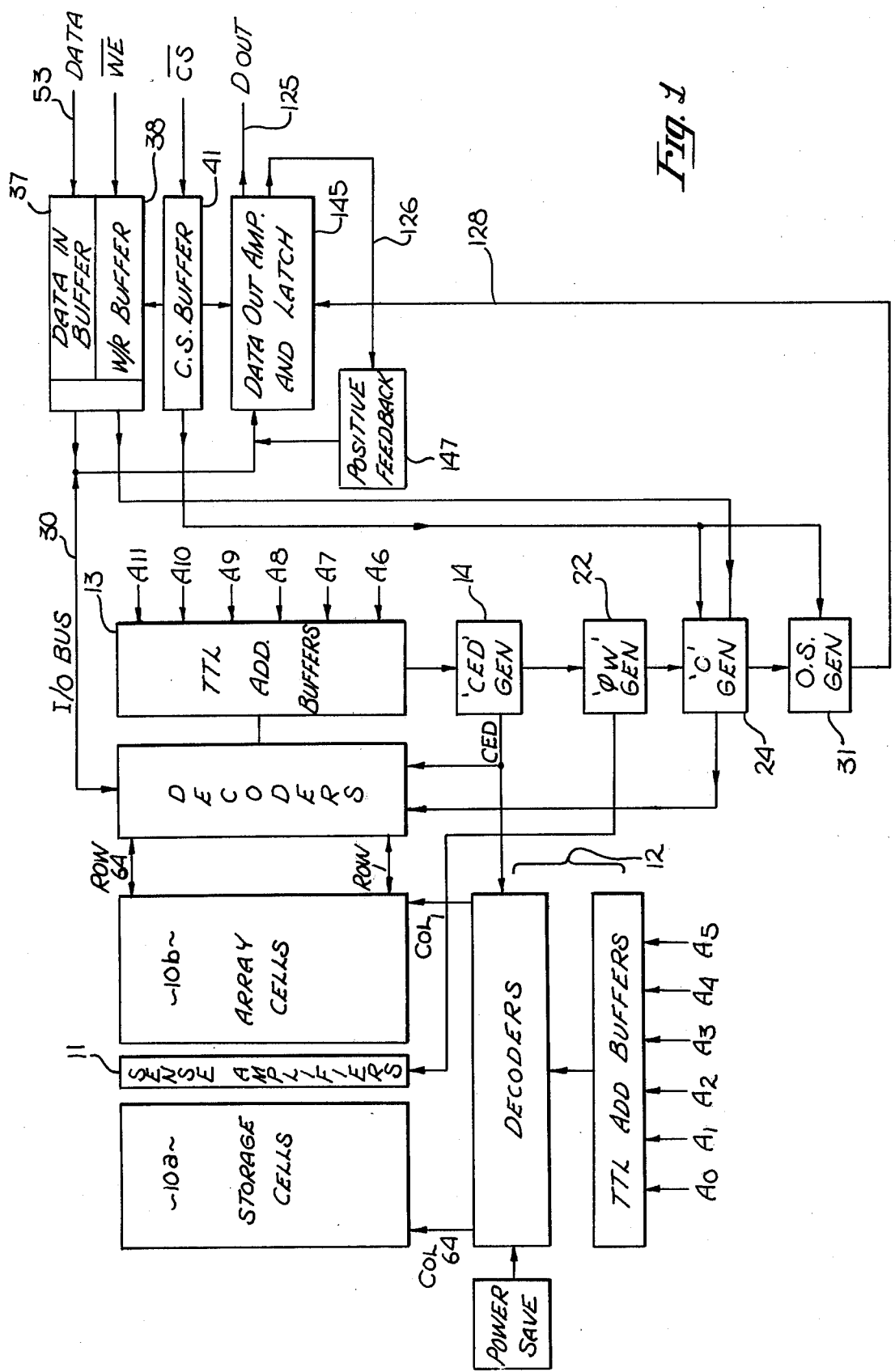
FIG. 1 is a general block diagram of the presently invented memory system and illustrates the memory array and the peripheral circuitry associated with reading, writing and refreshing information in the array.

Referring first to FIG. 1, the memory array includes cells 10a and cells 10b disposed on opposite sides of a clumn of sense amplifiers 11. Cells 10a include 64 rows and 32 columns while cells 10b include 64 rows and 32 columns. There is a single input/output bus 30 for the memory and as will be explained, the input/output bus communicates both with the cells 10b and with the cells 10a, the latter cells are coupled to the input/output bus 30 through the sense amplifiers 11. The memory utilizes a 12 bit address; 6 bits, shown as $A_0$ through $A_5$, are utilized by the column address buffers and decoders 12 for selecting a column line in the array. Address bits $A_6$ through $A_{11}$ are applied to the row address buffers and decoders 13 for selecting a row of the array. The specific circuitry of the column address buffers and decoders will be discussed in conjunction with FIGS. 3 and 4.

Binary data is received by the memory on line 53 and applied to a data-in buffer 37. In the presently preferred embodiment a single data-in line 53 and a single data-out line 125 are utilized. Thus, for purposes of reading and writing data the memory is a 4,096 × 1 memory. Among the signals received by the memory is a read-write signal (R/W) which is applied to the read-write buffer 38. Also the memory receives a chip select signal (C.S.) which is applied to buffer 41. The data-out amplifier and latch 145 receives data from the input/output bus 30 and furnishes the output data on line 125. This amplifier and latch shall be discussed in detail in conjunction with FIG. 6. Positive feedback is applied to the input/output bus 30 by amplifier 147 this amplifier receives a signal from the output amplifier on lead 126. This feedback, in addition to circuitry used for decoupling the input/output bus 30 from the output amplifier shall be discussed in detail in conjunction with FIG. 5.

A plurality of timing signals and power sources utilized by the memory system are generated by the memory system. Among these signals is the CED signal generated by generator 14 (FIG. 8), $\phi_W$ signal generated by generator 22 (FIG. 9), the C signal generated by generator 24 (FIG. 10) and the output strobe signal (O.S.) generated by generator 31. The waveforms of these timing signals shall be discussed in conjunction with FIG. 11.

In order to facilitate the explanation of the memory system, the following list of signals are identified. Group I represents those signals and power sources which are applied to the memory (data-out is also listed in Group I) while Group II represents those which are internally generated and utilized by the memory.

Group I
1. CE (chip enable)
2. $A_0$ through $A_{11}$ (address)
3. C.S. (chip select)
4. R/W (read/write)
5. Data-in
6. Data-out
7. $V_{SS}$ (ground)
8. $V_{CC}$ (+5 volts)
9. $V_{DD}$ (+12 volts)
10. $V_{BB}$ (substrate bias)

Group II
1. $\overline{CE}$ (a delayed, false CE signal)
2. $\overline{CEW}$ (the complement of CE)
3. CED (a $\overline{CE}$ signal delayed by an address buffer output)
4. B (a column decoder power "saver")
5. $\phi_W$ (sense amplifier strobe)
6. C (a timing signal for the row decoder and power saver)
7. O.S. (output strobe)
8. $V_{Ccom}$ (positive power supply derived from $V_{DD}$)

Figure 2:
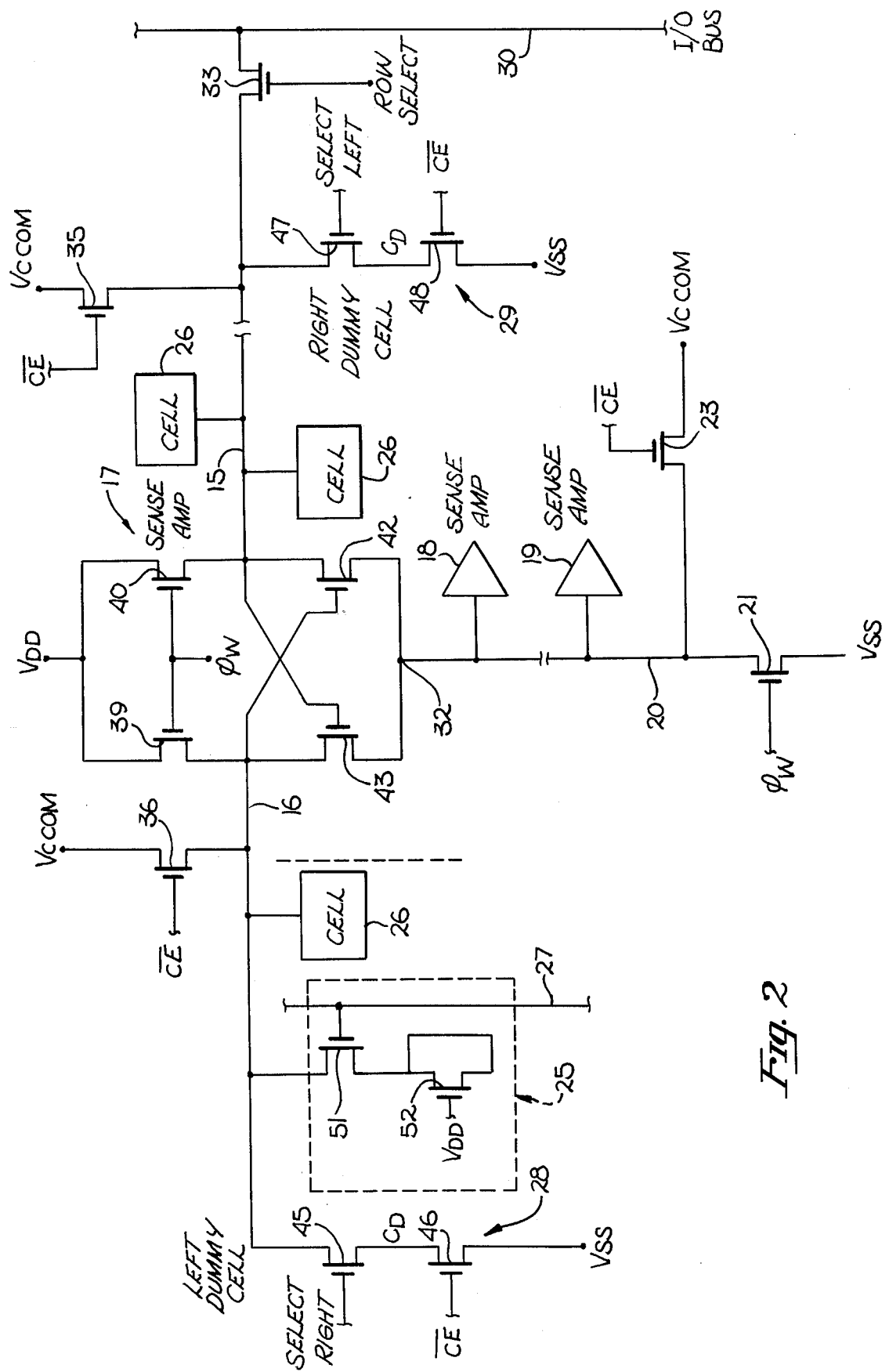
FIG. 2 is a partial circuit diagram of the memory array of FIG. 1 and illustrates a single row of the array and a sense amplifier which interconnects the right and left sections of the row line.

Referring to FIG. 2, a single row line of the array is illustrated. This line comprises a right row line 15 and a left row line 16. Both the right row line and left row line are coupled to the sense amplifier 17. Referring briefly to FIG. 1, sense amplifier 17 is one of a plurality of amplifiers contained within sense amplifiers 11. Similarly, sense amplifiers 18 and 19 (FIG. 2) would be disposed within the sense amplifier column shown in FIG. 1. In the presently preferred embodiment there are 64 sense amplifiers each being coupled to a right row line and a left row line. The right row line 15 is coupled to the input/output bus 30 through a row select transistor 33. The input/output bus 30 communicates with the left row line 16 through the sense amplifier 17. The sense amplifier line 20 is coupled to $V_{SS}$ through transistor 21 and to $V_{Ccom}$ through transistor 23. The gate of transistor 21 is coupled to the source of the $\phi_W$; the gate of transistor 23 is coupled to the source of the $\overline{CE}$ signal.

There are 32 cells for the presently preferred embodiment coupled to the left row line 16, and 32 cells coupled to the right row line 15. A few of these cells are shown such as cells 26. One of these cells which is coupled to a column select line, line 27, is shown in detail (cell 25). It will be appreciated that all the other cells are coupled to a column select line as is customarily the case with memory arrays. A dummy cell is disposed on each right row line and on each left row line. Specifically referring to FIG. 2, left dummy cell 28 is coupled to left row line 16, and right dummy cell 29 is coupled to right row line 15. Both the right row line and left row line are coupled to the potential $V_{Ccom}$ through the pull-up transistors 35 and 26, respectively. These transistors charge the row lines during the period of time when $\overline{CE}$ is positive.

Each storage cell of the array consists of a single element cell, that is, a cell containing only a single active device. Each cell includes a gating or selection device such as transistor 51 (cell 25, FIG. 2) and a capacitive storage means such as capacitor 52. The selection device, transistor 51, is coupled between a row line (line 16) and one terminal of the capacitor 52. The gate of selection transistor is coupled to a column select line such as column select line 27. While other capacitive means may be used for capacitor 52 in the presently preferred embodiment, the cell capacitor 52 comprises an MOS device having its source and drain terminal coupled together and its gate coupled to a source potential ($V_{DD}$). Such capacitive means are known in the art and may be fabricated utilizing known technology. Binary information is stored in the array in the form of an electrical charge, or lack thereof on each of the storage cell capacitors, such as capacitor 52 of cell 25.

Each dummy cell includes a pair of transistors coupled in series such as transistors 45 and 46 of the left dummy cell 28. These transistors are coupled between the row lines and $V_{SS}$. The gate of transistor 45 is coupled to the source of a select right signal and the gate of transistor 46 is coupled to the source of the $\overline{CE}$ signal. In a similar mannner, the right dummy cell includes transistors 47 and 48 which are coupled in series between the right row line 15 and $V_{SS}$. The gate of transistor 47, though, is coupled to the source of a select left signal. Each dummy cell includes a substantially constant parasitic capacitance primarily defined by the lead interconnecting the two transistors in the cell. This capacitance is shown as $C_D$.

During the read and refresh cycles when reading or refreshing is to be performed from a storage cell coupled to the right row line 15, a signal is generated which is applied to the transistor 45 of dummy cell 28. This signal is designated as "select-right", indicating that the right side of the array has been selected. In a similar manner, if a storage cell has been selected on the left side of the array, the dummy cell 29 would receive a signal which is applied to the gate of transistor 47 identified as "select-left" indicating that a cell on the left side of the array has been indicated. The select-right and select-left signals are generatd within the decoders utilizing known logic circuitry.

The sense amplifier 17 is primarily a flip-flop circuit having a first leg (transistors 39 and 43) and a second leg (transistors 40 and 42). Both legs of the sense amplifier 17 are coupled between $V_{DD}$ and $V_{SS}$ through transistor 21. The gate of transistor 43 is coupled to right row line 15 and the node defined by the connection between transistors 40 annd 42. Similarly, transistor 42 has its gate coupled to line 16 and the common node defined by the series connection of transistors 39 and 43. The gates of transistors 39 and 40 are coupled to the source of the $\phi_W$ signal. Each of the other amplifiers of sense amplifier 11 (FIG. 1) may be the same as sense amplifier 17 and connected in the same manner to their respective right and left row lines.

When current is flowing through the sense amplifier 17, it is apparent that lines 15 and 16 will be at different potentials because of the positive feedback provided through the gates of transistors 42 and 43 that is, the flip-flop of the amplifier will be in one of its bistable states. When a positive potential (a binary 1) is present on line 15, a low potential (a binary 0) will exist on line 16. Similarly, if a 1 is present on line 16, a 0 will be present on line 15. Thus, the sense amplifier 17 in transmitting signals from line 15 to line 16 inverts the signal. As previously mentioned, there is only a single input/output bus 30 and the left row line 16 communicates with this bus through sense amplifier 17. Thus, if a 1 is placed on line 30 during a write cycle and the selected cell for storing this 1 is on the left side of the array, the 1 will be stored as a 0 in the selected cell. The 1 on bus 30 which is coupled to line 15 through transistor 33, will appear as a 0 on line 16 due to the inverting effect of the sense amplifier 17. When this same stored signal is to be read from the same cell on the left side of the memory array it will be read as a 0 on line 16, but when transmitted to the input/output bus 30 through line 15 it will appear as a 1, again because of the inversion caused by the sense amplifier 17. Thus, a 1 is stored in the left side of the array as a 0, and a 0 is stored in the left side of the array as a 1. On the other hand, a 1 is stored as a 1, that is, a charge, in the right side of the array, and a 0 is stored as a 0, that is, the absence of charge in the right side of the array.

Referring to FIG. 2, assume that charge has been stored on capacitor 52 of cell 25, that cell 25 is selected and that the information stored within the cell is to be transferred to the input/output bus 30. Prior to the time that the reading begins, lines 15 and 16 are charged to $V_{Ccom}$ by transistors 35 and 36, respectively, as is line 20. Also during the period of time that $\overline{CE}$ is positive, transistors 46 and 48 of the dummy cells 28 and 29, respectively, are conducting, thus the capacitance means identified as $C_D$ will be effectively coupled to $V_{SS}$ and remain uncharged. During the read cycle (after $\overline{CE}$ returns to zero potential) the B generator 115 (shown in FIG. 40 allows the column decoder to select the addressed column. Assuming that column 27 of FIG. 2 has been selected, transistor 51 is turned on. Simultaneously with the application of a positive voltage to line 27, since the left side of the array has been selected, a signal is applied to transistor 47 of the right dummy cell 29. The dummy cell in effect always reads a signal approximately between the level of a 0 and a 1 onto its row line since its capacitance $C_D$ is always uncharged at the time the read cycle begins. When the positive signal is applied to column line 27 and to the select left line, charge will flow from capacitor 52 onto line 16 thereby raising the potential of line 16, while charge will flow from line 15 onto capacitor $C_D$ of the right dummy cell 29. After sufficient time has been allotted for the charge to be transferred, from the selected cell and the dummy cell, a positive signal is applied to the $\phi_W$ line, activating the sense amplifier 17. Since line 15 is at a lower potential then line 16, the positive feedback through transistor 42 and 43 will cause current to flow through the leg of the flip-flop comprising transistors 40 and 42. As a result, the sense amplifier 17 drives line 15 to a lower potential and line 16 to a higher potential. After sufficient time has lapsed for the sense amplifier to become stabilized, the selected row transistor, such as transistor 33, is activated by the C generator 24 (FIG. 1) allowing a signal to be transferred from line 15 onto the input/output bus 30.

The sense amplifier 17 is particularly effective because of the timing associated with the activation of the load transistors 39 and 40 and the application of the $V_{SS}$ potential to the common node 32 coupled to the sources of transistors 42 and 43 through transistor 21. Since the lines 15 and 16 (and hence the sources of transistors 39 and 40) are precharged to $V_{Ccom}$, the load transistors do not begin to conduct until the $\phi_W$ signal rises to a level greater than $V_{Ccom}$. On the other hand, the common node 32 is immediately coupled to $V_{SS}$ as the $\phi_W$ becomes positive. The delay in activating the load transistors 39 and 40 and results in a much higher gain in the sense amplifier 17 primarily because of the higher initial resistance associated with these loads.

Referring briefly to FIG. 11, the B generator output signal is illustrated on line 185. On line 186 the waveform for the $\phi_W$ signal is indicated, and its leading edge trails the leading edge of the B generator output by a timed $t_1$. The time $t_1$ is sufficient in duration to allow charge to be transferred between the selected cell and the row line. On line 187 the output from the C generator is illustrated. The leading edge of the C generator output is delayed from the leading edge of the $\phi_W$ signal by a time $t_2$. The time $t_2$ is sufficient in duration to allow the sense amplifier to stabilize in one state or the other.

If a 0 had been stored on capacitor 52 of FIG. 2 when reading occurred more charge would have been transferred from line 16 onto capacitor 52, than from line 15 onto the capacitor $C_D$ of dummy cell 29, and the flip-flop of sense amplifier 17 would have been set such that current would flow through transistors 39 and 43. In that case, line 15 would be brought to a potential of $V_{DD}$ less the threshold drop of transistor 40 and a 1 would be read on the input/output bus 30. In a like mannner, if a cell coupled to line 15 has been selected simultaneously with the selection of that cell, transistor 45 of dummy cell 28 is also selected and the sense amplifier 17 is set in one state or the other. Again, information may be read on the input/output bus 30 except that if a 1 is stored in a cell on the right side of the array, a 1 is read from the cell as previously discussed.

In the presently preferred embodiment of the invention the ratio of the dummy cell capacitance $C_D$ to storage cell capacitance (capacitor 52) is approximately 0.5 for an uncharged cell. Note that a portion of the capacitance associated with capacitor 52 is due to junction capacitance and that this capacitance is a function of bias. Thus, when no charge is contained on capacitor 52 its effective capacitance is greater than for a case when a 1 is stored within the cell. The dummy cell, since it always writes a 0 onto the row line, assists the selected storage cell for the case when the storage cell is transferring a 1 onto the row line. However, the fact that the storage cell's effective capacitance is greater for the case when a 0 is stored in the storage cell assists to counter the effects of the dummy cell capacitance where a 0 is stored. Among the advantages to using the dummy cell is that some common mode noise rejection is obtained because a select signal is simultaneously applied to both the right and left row lines.

After information has been read from the storage cell onto the row line the flip-flop of the sense amplifier 17 reinforces the 1 or 0 read from the storage cell, thus enabling refreshing of the 1 or 0 stored on the capacitor 52. By way of example, if line 15 becomes more positive during reading due to the transfer of charge onto the line from a storage cell, when the flip-flop of the amplifier 17 is activated line 15 will be pulled to $V_{DD}$. The sequence and time delays associated with the turning-off of the sense amplifier, row select transistor 33 and select line 27 are important for proper refreshing, particularly the refreshing of a zero. First, the row select transistor 33 is turned off as indicated by the trailing edge of the C signal on line 187 of FIG. 11. This decouples the row line from the high capacitance associated with the I/O bus 30.

Following this the $\phi_W$ signal is returned to 0. The conducting resistance of the load transistors of the flip-flop, transistors 39 and 40, is much larger than that of transistors 42 or 43 or for that matter, transistor 21. Thus, when $\phi_W$ is removed from the gates of the load transistor, these transistors (since they are operating as source followers) cease conducting very rapidly. Assume for the sake of explanation that when this occurs line 16 is at a low potential while line 15 is at a high potential, the removal of $\phi_W$ drives line 16 to $V_{SS}$ since transistors 43 and 21 do not turn off as rapidly. Note that line 16, prior to the time $\phi_W$ is removed, is at a level higher than $V_{SS}$ because of the voltage dividing effect of transistors 39, 21 and 43, and unless line 16 is brought to $V_{SS}$ or lower, a true 0 would not be returned to the selected cell.

Following the removal of the $\phi_W$ signal the column select signal from the B generator, line 180 of FIG. 11, is brought to zero potential. By way of example, line 27 (FIG. 2) would be returned to zero potential, thus causing transistor 51 of cell 25 to cease conducting. The capacitive coupling from the gate to source of transistor 51 drives the storage node, capacitor 52, to a lower potential than $V_{SS}$. Thus, by proper sequencing of the B generator signal, $\phi_W$ signal and C generator signal, the right or left row line which is at a low potential is first brought to $V_{SS}$, and finally, the storage capacitance of the cell is brought to a potential lower than $V_{SS}$ through capacitive coupling. In FIG. 11 the trailing edges of the B signal, $\phi_W$ signal and C signal separated in time by the dotted lines 190 and 191.

From the above description it may be seen that reading also refreshes the stored information. Refreshing is also accomplished, without reading, by not selecting a row select transistor such as transistor 33 of FIG. 2. In such an event an entire column of the array may be simultaneously refreshed.

Write Signal and Date-In Buffer

Figure 7:
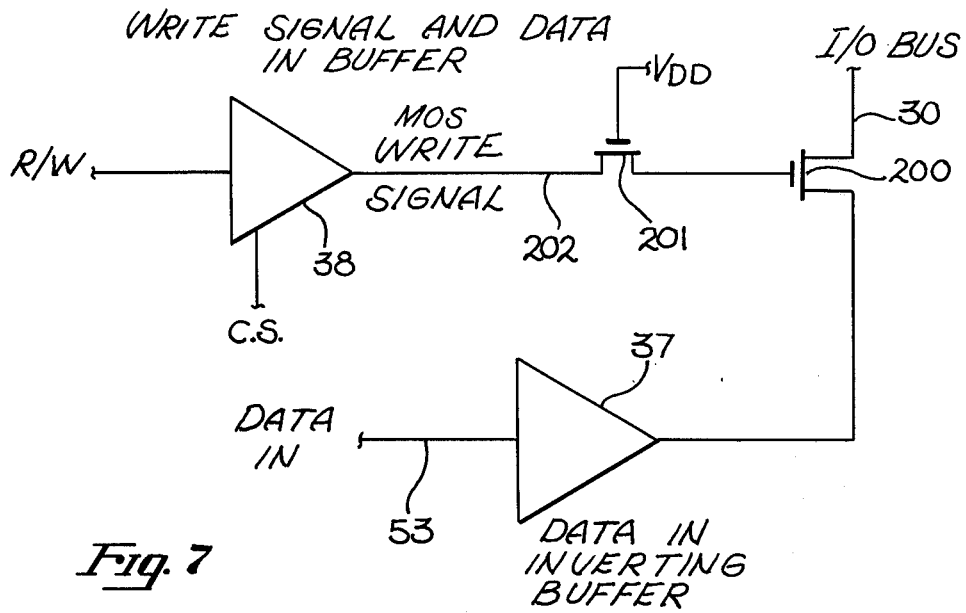
FIG. 7 is a circuit diagram illustrating the write function of the invented memory.

Referring to FIG. 7, the write buffer 38 generates a write signal which is coupled to the drain of transistor 201. The source of transistor 201 is coupled to the gate of transistor 200. Transistor 200 couples the data-in inverting buffer 37 with the input/output bus 30 when a positive signal is generated by the buffer 38. In the presently preferred embodiment a write signal is generated on line 202 only when a chip select signal is present and when the R/W signal is in its low state. When this occurs a positive signal is generated on lead 202 and information may be writted onto the input/output bus from buffer 37. If the chip is not selected and the R/W line is low, a refresh will occur. When the R/W signal is high or positive, the memory is accessible for reading provided that the chip select signal again occurs. If the R/W is high, but no chip select signal is present then a refresh occurs. In the presently preferred embodiment if the R/W signal is high or positive at the time the CE signal becomes positive, again provided that chip select signal is present, a read cycle will occur. If on the other hand, the R/W signal drops in potential at the time the CE signal becomes positive, then a write cycle begins, again provided the chip selected signal is present. If the R/W signal drops when the CE signal is positive, then a modified read-write cycle occurs.

Assuming information is to be written into a selected cell, the information is inverted by the data-in buffer 37 before it is applied through transistor 200 to the input/output bus 30. Thus, if a 1 is placed on line 53, a 0 is written into the selected cell. The 1 appearing on line 30, referring briefly back to FIG. 2, assuming again cell 25 is selected, will be written into cell 25 through line 15, sense amplifier 17 and finally through transistor 51. The signal on line 30 overpowers any existing condition of the sense amplifier 17, line 15 or line 16 during a write cycle. The activated dummy cell (on the opposite side of the array from the selected cell) is activated, but once again the input/output bus overpowers the dummy cell and the capacitance of the dummy cell does not inhibit the writing. The source to gate capacitance of transistor 200 bootstraps the gate of transistor 200. Transistor 201 allows the gate of transistor 200 to rise to a potential higher than $V_{DD}$. The data-in inverting buffer 37 and the R/W buffer 38 may be constructed from known circuitry.

Address Buffer and Latch

Referring to FIG. 3, a detailed circuit diagram of the TTL compatible address buffer and latch is illustrated and includes an input line 63 for receiving a bit of the address and output lines 64 (shown as $\overline{A}$) and 65 (shown as A). Each bit of the address, that is, each of the 12 bits of the address of the presently preferred embodiment, are coupled to a buffer and latch such as the one illustrated in FIG. 3.

The buffer includes a bistable circuit or flip-flop, one leg of which includes transistors 75 and 83 and the other leg of which includes transistors 76 and 84. Both legs are coupled between $V_{DD}$ (line 57) and one terminal of transistor 79. The other terminal or source terminal of transistor 79, is coupled to the ground line 56 ($V_{SS}$). The load transistors 75 and 76 of the flip-flop have their gates coupled to a source of potential identified as PB. This potential is derived from the $V_{CC}$ source, and charges the gates of transistors 75 and 76 to $V_{DD}$ less a threshold of a gating transistor during the time that $\overline{CE}$ is positive. Nodes 91 and 92 of the flip-flop circuit are coupled together through an equalizing transistor 73 so that where $\overline{CE}$ is positive the potential on these nodes is equalized. Node 91 is coupled to the gates of transistors 84, 86, 70 and 67, and to the drain terminal of transistor 80. Likewise, node 92 is coupled to the gates of transistors 83, 85, 68 and 69, and to the drain of transistor 81. The input to the circuit, line 63, is coupled to node 91 through transistors 85 and 80. A reference potential for node 92 is established by transistors 81 and 86 (and also transistor 76).

Transistors 67 and 68 act as a push-pull amplifier for driving line 64 and receive their power from $V_{DD}$ through transistor 78. Similarly, transistors 69 and 70 drive line 65 and receive their power from $V_{DD}$, again through transistor 78. Transistors 87 and 88 pull-down lines 64 and 65 respectively when $\overline{CE}$ is high or positive and assure that no charge remains on these lines. Transistors 78, 79, 80 and 81 have their gates coupled to CE, and are used to prevent the flow of current during the time that $\overline{CE}$ is high.

In operation the address should be valid (at the buffer) prior to the time that CE becomes positive and remains present on the input line 63 long enough for the flip-flop circuit to become stabilized. During the period that $\overline{CE}$ is positive the output lines 64 and 65 are held at $V_{SS}$; PB, that is the gates of transistors 75 and 76 are precharged positively and nodes 91 and 92 are coupled together through transistor 73. The flip-flop, of course, during $\overline{Ce}$ is not conducting since the current path to $V_{SS}$ is interrupted by transistor 79. Since the address is received prior to the time that CE becomes positive (that is, before current begins to flow through the flip-flop), the flip-flop is "preset" as will be explained.

Assume first that the input to line 63 is low when CE becomes positive. Current will then flow through transistors 75, 80 and 85 causing node 91 to drop in potential towards $V_{SS}$. This will cause the flip-flop to set such that transistors 75 and 83 conduct more heavily than transistors 76 and 84, partly because of the positive feedback to node 92. Since node 91 is low, transistor 67 does not conduct, while on the other hand, device 68 is conducting, causing line 64 to be held close to the potential of $V_{SS}$. In a converse manner, since device 69 is conducting, line 65 will be positive, that is, at a potential of node 92 less the threshold drop of drop of transistor 69 but no more positive than the positive level of chip enable less the threshold drop of transistor 78.

If at the time that CE became positive a high signal has been applied to line 63, the flip-flop would have been set such that transistors 76 and 84 conducted heavily as compared to transistors 75 and 83. A current path would exist in this circumstance from $V_{DD}$ through transistors 76, 81 and 86 causing node 92 to become low. This in turn would cause line 65 to be at approximately $V_{SS}$ since transistor 70 would be conducting and, a positive signal on line 64 since transitor 67 would conduct. Transistors 68 and 69 would not be conducting since 92 is low. Note that after the address is removed from line 63, as long as CE remains positive, the address buffer remains latched, that is, the flip-flop remains set. It should also be noted that when CE becomes positive the node comprising the gates of the load transistors 76 and 75 is capacitively coupled to this signal, thereby driving the gates of transistors 75 and 76 more positively. To assure proper operation of the buffer, symmetry is maintained between the mirror image transistors insofar as their conducting resistance is concerned, except that transistors 85 has less conducting resistance than transistor 86. The buffer and latch of FIG. 3 may also be used for receiving other signals (other than address signals), for example, the chip select signal.

Decoder

In FIG. 4 a decoder of the presently disclosed memory is illustrated along with the B generator. The decoding principle for the decoder of FIG. 4 is the same as a dynamic NOR GATE; and includes a plurality of parallel transistors 96, 97, 98, 99, 100 and 101 which are coupled to receive the address for either a column or a row of the memory. In the presently preferred embodiment 6 of the address bits are utilized for selecting a row, and 6 address bits are used for selecting a column in the 64 × 64 array. While the decoder of FIG. 4 is illustrated coupled to all three signals, that is, $A_0$, $A_1$, $A_2$, $A_3$, $A_4$ and $A_5$, the inverse signals i.e., $\overline{A_0}$ etc., are used in a standard manner in order to allow selection of any row or column in the array.

The decoder transistor 96 through 101 are coupled between node 104 and $V_{SS}$. Node 104 is coupled to $V_{DD}$ through transistor 102, and this node is charged to $V_{DD}$ less a threshold drop during the period when $\overline{CE}$ is positive. The output from the decoder (line 121) is powered through the output transistor 110 from the B generator 115. As will be explained the B generator is utilized as a current limiting device. The gate of the output transistor 110 is coupled to node 105 as is one terminal of bootstrap capacitor 108. The other terminal of capacitor 108 is coupled to the drain of pull-down transistor 109; the source terminal of transistor 109 is coupled to $V_{SS}$.

The decoupling transistor 107 which is used for coupling and decoupling nodes 104 and 105 has its gates coupled to a voltage divider comprising transistors 112 and 113. These transistors are connected between $V_{DD}$ and ground line 56. The bleeder transistor 112, as will be explained in more detail, is used to assure that the gate of the decoupling transistor 107 remains at a potential less than $V_{DD}$.

First the operation of the decoder of FIG. 4 will be examined during the period when $\overline{CE}$ is positive. During this period the B generator is effectively off, and hence no power is applied to the drain of the output transistor 110, or for that matter to the drains of any of the other output transistors of the other decoders. Also during this period the bleeder transistor 112 is not conducting, thus the gate of the coupling transistor 107 is coupled to $V_{DD}$ through transistor 113. Node 104 is precharged during $\overline{CE}$ through transistor 102, as are the equivalent nodes in the remainder of the decoders. Node 105 likewise becomes charged since it is coupled to node 104 through trnsistor 107. Note that there are a plurality of nodes similar to nodes 104 and 105, (since there are a plurality of decoders); all of these nodes are precharged at the same time. Moreover, there is substantial overlap capacitance, coupling the gates of the decoupling transistors 107, and as the potential on these nodes rises, it feeds through onto the gate of the decoupling transistor 107 causing its gates to become more positive. This effect aids in the precharge of node 105 since better couling is obtained between this node through transistor 107.

At the time CE becomes positive, if the decoder has been selected, node 104 remains positive as does the gate of transistor 110 (node 105). When this occurs an output signal is obtained on the output line 121 and is enhanced by the bootstrap capacitance 108. On the other hand, if the decoder has not been selected, node 105 and node 104 discharge through one or more of the decoder transistors 96 through 101. The overlap capacitance previously mentioned (for the nonselected decoders) tends to cause the gate of the decoupling transistor 107 to become lower in potential. However, since transistor 107 is being driven in an inverted manner (that is, node 105 is more positive than node 104) very insignificant delay in discharging node 105 is encountered.

Initially when CE becomes positive, the gates of all the output transistors of the decoders such as transistor 110 are charged, and hence the load on the B generator is quite large (low in resistance). As will be discussed shortly, the potential on the drains of the output transistors remains low until such time as the load on the B generator is reduced. This reduction in load occurs as the gates of the output transistors of the unselected decoders discharge.

The B generator 115 includes a transistor 116 coupled between the source of the CE signal, and the gate of transistor 117 and one terminal of capacitor 119. The gate of transistor 116 is coupled to $V_{DD}$, line 57, as is the drain of transistor 117. The output from the B generator, the source of transistor 117 and the other terminal of capacitor 119 are also coupled to the drain of transistor 118. The source of transistor 118 is coupled to ground while the gate of transistor 118 receives the $\overline{CEW}$ signal. During the time that the decoding is actually taking place within the decoders the B generator limits the current being delivered to the output transistors of the decoders. During the period that $\overline{CE}$ is positive (note that $\overline{CEW}$ is a true complement of CE) the output from the B generator is substantially held at $V_{SS}$. When CE becomes positive the output from the B generator is coupled to the output transistors of the decoders and transistor 117 limits the current flow. It it were not for the current limiting effect of transistor 117, an intolerable amount of current would be drawn. As the output transistors of the unselected decoders cease to conduct, the load on the B generator greatly decreases, for example all but one of 64 decoders remain coupled to the B generator. When CED returns to zero potential (indicating that the address has been received) transistor 109 ceases to conduct, thus the output line 121 rises in potential. This rise in potential of output line bootstraps the gate of transistor 117 through capacitor 119, thus causing the output of the B generator to rise (see FIG. 11, lines 184 and 185).

The B generator illustrated in FIG. 4 is utilized for the 64 column decoders in the presently preferred embodiment. A circuit performing the same function as the B generator is used for driving the output of the row decoders. This signal generated by the C generator shall be discussed in conjunction with FIG. 10. An important feature of the B-generator 115 (and also the C generator) is that no D.C. current is drawn from the source of the CE clock. This is a significant improvement over prior art memories which placed D.C. loads on the clock signal sources.

After CE becomes positive CED returns to zero potential, that is CED is delayed from CE (see waveform on line 184 of FIG. 11). When CED returns to zero, transistor 109 ceases to conduct allowing the decoder output to rise in potential. Node 105 becomes bootstrapped through capacitor 108 thereby driving the gate of transistor 110 more positively. As node 105 rises in potential decoupling transistor 107 for the selected decoder is shut off thereby decoupling node 105 from 104. This allows node 105 to rise more quickly in potential since the capacitance associated with node 104 is no longer coupled to node 105. Note that at this time the gate of transistor 107 is coupled through transistor 112 to $V_{SS}$, this transistor having a relatively high resistance. Transistor 112 maintains the gate of the coupling transistor at a controlled potential less than $V_{DD}$, thus allowing quicker decoupling of nodes 104 and 105.

DATA OUTPUT FEEDBACK & DECOUPLER

As previously mentioned during a read cycle, the selected cell either increases or decreases the potential on the selected row line. Referring to FIG. 5, the circuit shown therein couples this increase or decrease of potential on the selected row line to an output differential amplifier 145 (which also latches) and decouples the input/output bus from the output amplifier during the output strobe. In FIG. 5 the row line 15 is illustrated coupled to the input/output bus 30 through transitor 33. The input/output bus is coupled to the output amplifier 145 through the coupling transistor 137. Both the source and drain of the coupling transistor 137 are coupled to potential $V_{Ccom}$ through pull-up transistors 133 and 134. The gates of these two transistors are connected to the source of the $\overline{CE}$ signal. The output amplifier 45 provides a positive feedback signal on line 126 which is fed back onto the input/output bus 30 through the feedback amplifier 147. Feedback amplifier 147 may be an ordinary buffer amplifier and is used to supply a positive feedback to the bus 30. The source of the input signal to the feedback amplifier will be discussed in detail in conjunction with the output amplifier (FIG. 6). The output amplifier 145 is a differential amplifier and compares the signal on node 140 with the signal on node 130 as will be discussed.

The gate of the coupling transistor 137 is coupled to the source of the pull-up transistor 135. The drain of transistor 135 is coupled to $V_{DD}$. A bootstrap capacitor 142 is coupled between the source of the row select signal and the gate of the coupling transistor 137. The gate of the coupling transistor 137 is also coupled to a pull-down transistor 143, this transistor has its gate coupled to line 128, the output strobe signal line.

Prior to the time that a row has been selected and during the time that CE is positive node 140 and the input/output bus 30 are charged to the potential $V_{Ccom}$ by the pull-up transistors 133 and 134. Also the gate of transistor 137 is likewise charged to a positive potential by the pull-up transistor 135. After $\overline{CE}$ returns to a zero potential, and when the row select signal is received transistor 33 conducts (during the read cycle) and either transfers additional charge onto the input/output bus 30 or removes charge from the input/output bus 30. The row select signal is also applied to capacitor 142, and through this capacitor the signal boosts the gate of the coupling transistor 137, thereby allowing the difference of charge on the input/output bus 30 to be either transferred onto node 140 or removed from node 140.

When the output strobe signal is received the output amplifier 145 senses the increase or decrease of charge on node 140. Simultaneously with this occurrence transistor 143 conducts thereby discharging the gate of coupling transistor 137. This decouples node 140 from the input/output bus 30. Also, to assure proper decoupling feedback amplifier 147 provides positive feedback of the output signal thereby driving line 30 higher in potential or lower in potential. In FIG. 11, line 188, the waveform of the O.S. signal is shown. The leading edge of the O.S. signal is delayed from the leading edge of the C signal (row select) by a time $t_3$. The duration of $t_3$ is sufficient to assure that charge has been transferred from the bit sense line (e.g., row line 15) to the output amplifier (node 140).

In FIG. 6 the data output amplifier 145 which includes a latching circuit is illustrated in detail. The potential on node 140, the input to the amplifier, is compared with the potential on node 130. The output amplifier includes a flip-flop circuit comprising transistors 149 and 154 in a first leg and transistors 150 and 155 in a second leg. Both legs of the flip-flop are coupled between $V_{DD}$ and $V_{SS}$ through the current saving transistors 157. The gate of the current saving transistor 157 is coupled to the output strobe line 128 such that current only flows in the flip-flop during the period that the output strobe is positive. Node 130 is coupled to node 140 through the equalization transistor 152 and during the period of time that $\overline{CE}$ is positive these two nodes are coupled together through transistor 152. The gates of the flip-flop load transistors 149 and 150 are coupled to the source of the pull-up transistor 159 and this transistor couples the gates of the load transistors to $V_{Ccom}$ during the period of time that CE is positive. These gates are boosted through capacitor 161 when the output strobe becomes positive. Node 130 is also precharged during the time that $\overline{CE}$ is positive through pull-up transistor 160.

As discussed in conduction with FIG. 5, node 140 is precharged and after one of the row lines in the array has been coupled to the input/output bus the potential on node 140 increases or decreases to a potential higher or lower than the potential on node 130. This causes the flip-flop to be set in one of its two stable states when the output strobe is received. By way of example, if charge is transferred onto node 140, node 140 will be at a higher potential than node 130, this will cause transistor 155 to conduct more heavily than transistor 154 thereby setting the flip-flop such that the leg of the flip-flop comprising transistors 150 and 155 conducts. The flip-flop acts as a latch and remains set as long as the output strobe is present.

The output from the flip-flop is applied to two pairs of transistors which operate as push-pull amplifiers. The first pair comprises transistors 164 and 165 and the second pair comprises transistors 166 and 167. Both pairs of transistors are coupled between $V_{DD}$ (through the current saving transistor 170) and $V_{SS}$. The gates of transistors 165 and 166 are coupled to node 130 while the gates of transistors 164 and 167 are coupled to node 140. The common node between transistors 166 and 167 is coupled to the feedback line 126 prviously discussed in conjunction with FIG. 5. The common node between transistors 164 and 165 is used to drive the output transistor 172. It is apparent that current only flows through this amplification stage when the output strobe is present since transistor 170 only conducts during the time that the output strobe is positive.

The output transistor 172 has its drain coupled to $V_{CC}$ and its source coupled to the data output line 125. The source of the output transistor 172 is coupled to the drain of transistor 174 and transistor 174 in conjunction with transistors 176, 177, 178 and 179 provide a tri-state output as will be discussed.

Line 125 is coupled to ground through transistor 174. The gate of transistor 174 is coupled to the common node between the series combination of transistors 176 and 177. Transistor 176 has its drain coupled to the source of the chip select signal while the source of transistor 177 is coupled to the ground line, $V_{SS}$. Transistors 178 and 179 are likewise coupled in series with the drain of transistor 179 being coupled to $V_{DD}$ and the source of transistor 178 being coupled to the ground line. The gates of both transistors 177 and 178 are coupled to the common node between transistors 164 and 165, this node also including the gate of the output transistor 172. The gate of transistor 176 is coupled to the common node between transistors 178 and 179 and the gate of transistor 179 is coupled to the source of the $\overline{CE}$ signal.

If the chip is unselected the O.S. timing signal is inhibited, thus preventing transistor 170 from conducting and leaving nodes 130 and 140 precharged to $V_{Ccom}$. This results in the gate of transistor 172 falling to $V_{SS}$ since transistor 165 will be on, thereby preventing transistor 172 from conducting. The drain of transistor 176 will be at $V_{SS}$ since the chip is deselected and the gate of transistor 174 will also be at the potential of $V_{SS}$, thus preventing transistor 174 from conducting. Since both transistors 172 and 174 are not conducting the output line 125 presents a high impedence.

If on the other hand, the chip is selected and the output is high, at the beginning of the CE signal both transistors 172 and 174 are not conducting. After the chip select signal becomes positive and since transistor 176 is conducting, the gate of transistor 174 will become positive keeping the output low. When the O.S. is generated, if node 140 is to become positive and node 130 is to become low in potential, transistors 170, 164, 172, 178 and 177 conduct and transistors 166, 165, 176 and 174 do not conduct. Thus, since transistor 172 is conducting and transistor 174 is off the output line 125 becomes high. If the chip has been selected and a low output is read, line 125 is held low as described above until the O.S. signal becomes positive. When the O.S. signal is generated, and if node 140 is decreased in potential while node 130 increased, transistors 164, 167, 172, 178 and 177 do not conduct and transistors 170, 166, 165 and 179 conduct. Thus, transistor 172 remains non-conducting and transistor 174 remains on keeping the output line 125 at a low potential.

CED Generator

Figure 8:
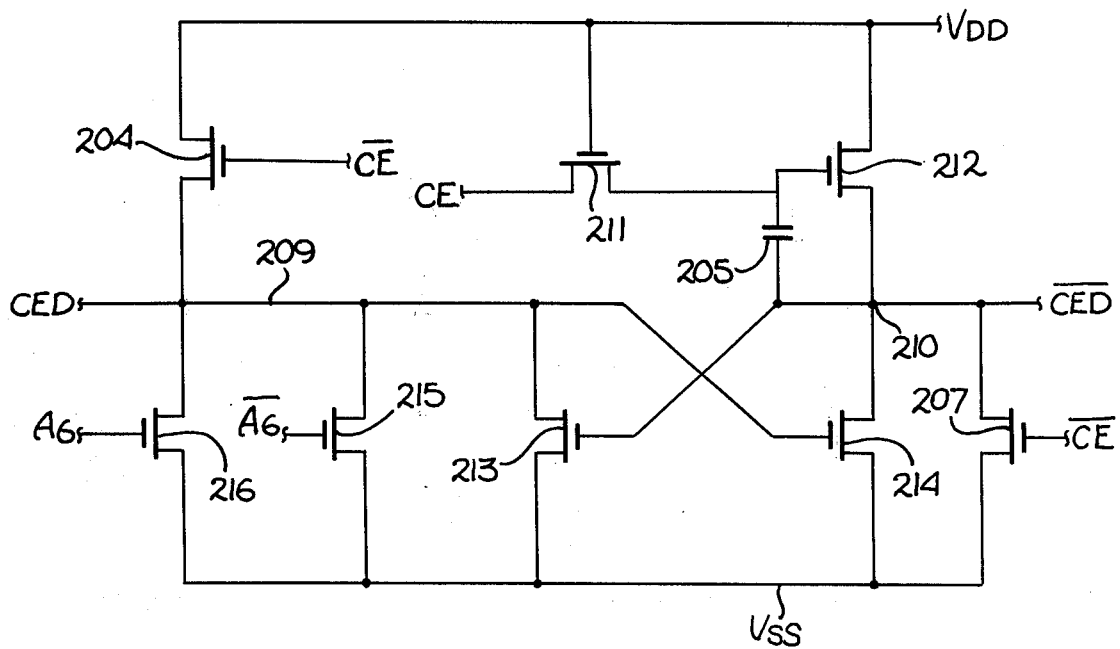
FIG. 8 is a circuit diagram of the CED generator employed in the memory of FIG. 1.

In FIG. 8 the CED and CED generator is illustrated (the waveform of the CED signal is illustrated in FIG. 11 on line 184). The CED generator utilizes the CE signal and CE signal (shown on lines 183 and 189 of FIG. 11) and the true and complementary output of one of the address buffers in order to generate the CED and CED signals. As previously mentioned, the output from the CED generator is a signal primarily based on CE time, but delayed sufficiently to assure that an address has been received and processed through the address buffers.

The CED output of the generator is shown as node 209, the $\overline{CED}$ output as node 210. Feedback transistor 213 has its drain coupled to node 209, its source coupled to $V_{SS}$ and its gate coupled to node 210. Feedback transistors 214 has its gate coupled to node 209 and its source and drain terminals coupled between nodes 210 and $V_{SS}$. Pull-down transistors 207 is coupled between node 210 and $V_{SS}$, and pull-up transistor 204 is coupled between node 209 and $V_{DD}$. The decoder delay is assured by transistors 215 and 216 which are coupled in parallel between node 209 and $V_{SS}$. The gate of transistors 215 and 216 are coupled to the address signals $\overline{A_6}$ and $A_6$, respectively, at the output of the address buffer (lines 64 and 65, FIG. 3). Transistor 212 is coupled between $V_{DD}$ and node 210. Its gate is coupled to the source of the CE signal through transistor 211 and to node 210 through capacitor 205. The gate of transistor 211 is coupled to $V_{DD}$.

During the time that $\overline{CE}$ is positive transistor 204 will conduct raising the potential on node 209 to $V_{DD}$. Node 210, on the other hand, is coupled to $V_{SS}$ through transistor 207 since that transistor is conducting. At the time that CE becomes positive capacitor 205 becomes charged through transistor 211. Additionally, transistor 212 begins to conduct, but since transistor 214 is also conducting, node 210 remains substantially at $V_{SS}$. After the address buffers have received valid address signals and processed them, either transistors 215 or 216 will begin conducting. This will cause node 209 to begin discharging towards $V_{SS}$. The positive feedback provided through the gate of transistor 214 will cause node 210 to rise in potential since transistor 214 begins to turn-off. Likewise, the positive feedback provided from node 210 through the gate of transistor 213 causes transistor 213 to conduct, discharging node 209. Capacitor 205 provides additional positive feedback causing transistor 213 to conduct more quickly thereby providing a sharper leading edge on the CED signal. It is apparent that the CED signal will not occur until a valid address has been received and been processed through the address buffers. Moreover, additional delay is obtained from the CED generator, this delay being primarily determined by transistors 213 and 214 and the capacitances associated with nodes 209 and 210.

Referring briefly to FIG. 1, the output of the CED generator in addition to being coupled to the decoders 12 and 13 is also coupled to the $\phi_W$ generator 22. The output from the $\phi_W$ generator 22 in addition to being coupled to the sense amplifiers 11, is also coupled to the C generator 24. And the output of the C generator 24 in addition to being utilized by the row select transistors, is also used by the O.S. generator 31. As previously discussed, the output from the CED generator 14 is delayed by the output from at least one of the address buffers, and also, by a duration of time determined by the CED generator 14 circuitry. The output from the CED generator is used to trigger the $\phi_W$ generator, thus assuring that the output from the $\phi_W$ generator 22 is delayed from the output of the CED generator 14. Likewise, the output from the $\phi_W$ generator 22 is used to trigger or delay the output from the C generator 24, and finally the output from the C generator is used to trigger the output from the O.S. generator 31. Thus, any delays associated with processing parameters or variations for the buffers are automatically compensated for because of the "chain reaction" interconnection of the generators.

$\phi_W$ Generator

Figure 9:
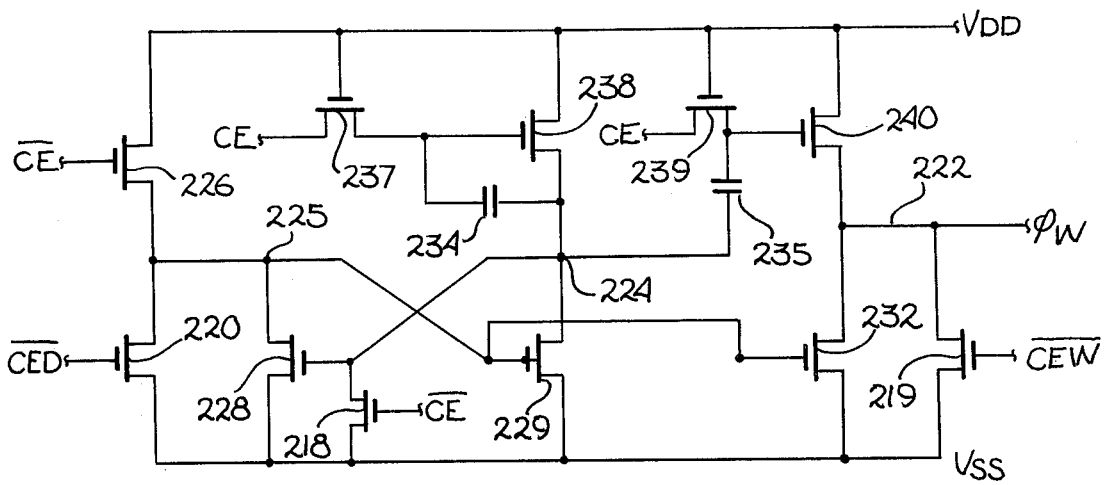
FIG. 9 is a circuit diagram of the $\phi_W$ generator employed in the memory of FIG. 1.

Referring to FIG. 9 and the $\phi_W$ generator illustrated therein, the output from the $\phi_W$ generator is initiated by the $\overline{CED}$ signal applied to the gate of transistor 220. The output $\phi_W$ which appears on node 222 is also delayed by the internal circuitry of the $\phi_W$ generator. Feedback transistor 229 has its gate coupled to node 225 and its source and drain terminals coupled between $V_{SS}$ and node 224.

Feedback transistor 228 is coupled between node 225 and $V_{SS}$ and has its gate coupled to node 224. Pull-down transistor 218 assures that node 224 is discharged during the period of time that $\overline{CE}$ is positive. Pull-down transistor 219 which is coupled between node 222 and $V_{SS}$ assures that the output node 222 is coupled to $V_{SS}$ during the period of time that the $\overline{CEW}$ signal is positive. Pull-up transistor 226 which is coupled between node 225 and $V_{DD}$, precharges node 225 to $V_{DD}$ less a threshold during the period of time that the $\overline{CE}$ signal is positive. A bootstrap circuit comprising transistors 237 and 238 and capacitor 234 is used for boosting the gate of the output transistor 240 through capacitor 235. Transistor 237 is coupled between the source of the CE signal and the gate of transistor 238, the gate of transistor 237 is coupled to $V_{DD}$. Transistor 238 has its drain coupled to $V_{DD}$, its source coupled to node 224 and its gate coupled to one terminal of transistor 237 and capacitor 234. The output transistor 240 has its drain coupled to $V_{DD}$ and its source coupled to the output node 222. The gate of transistor 240 is coupled to one terminal of transistor 239 and capacitor 235. Transistor 239 is used to couple the CE signal to the gate of transistor 240. Transitor 232 has its gate coupled to node 225, and hence this transistor conducts during the time that $\overline{CE}$ is positive. The conduction of transistor 232 during this period of time couples node 222 to $V_{SS}$.

In order to understand the operation of the $\phi_W$ generator, a brief comment on prior art bootstrapping circuits will be helpful. Typically, in the prior art, if transistor 240 of FIG. 9 were to be bootstrapped, a capacitor would be used between node 222 and the gate of transistor 240. In order to raise the potential of the gate of transistor 240, it is necessary for the potential on the load to rise in order to provide the bootstrapping through the bootstrap capacitor. In many cases though, the load on the generator includes considerable capacitance, and hence the rise in potential on the gate of the output transistor is delayed or slowed by the output capacitance. Referring to FIG. 9, unlike prior art bootstrapping circuits, the gate of the output transistor 240 is bootstrapped through capacitor 235 to a bootstrapping circuit which comprises transistors 237, 238 and capacitor 234.

In the operation of the $\phi_W$ generator, during the period of time that $\overline{CE}$ is positive, node 225 is charged to $V_{DD}$ and node 222 is held at $V_{SS}$. After $\overline{CE}$ returns to zero potential and the CE signal becomes positive capacitors 234 and 235 are charged. Capacitor 234 is charged through transistor 237 (note that transistor 229 is still conducting since node 225 has previously been charged to $V_{DD}$ through transistor 226.) Similarly, capacitor 235 is charged through transistor 239. When $\overline{CED}$ becomes positive node 225 begins to discharge through transistor 220. This causes transistor 229 to cease conducting, and thus node 224 rises in potential. As node 224 rises in potential, the gate of transistor 238 becomes bootstrapped raising the potential on node 224 to $V_{DD}$. As the potential on node 224 increases, it bootstraps the gate of the output transistor 240 allowing the output node 222 to reach the potential of $V_{DD}$. Transistors 237 and 239 allow the gates of transistors 238 and 240, respectively, to reach a potential greater than $V_{DD}$. Thus, the positive output on node 222, $\phi_W$, will not occur until the $\overline{CED}$ signal becomes positive, and then the output is delayed by a predetermined period of time which is a function of the delay inherent in the $\phi_W$ generator.

C Generator

Figure 10:
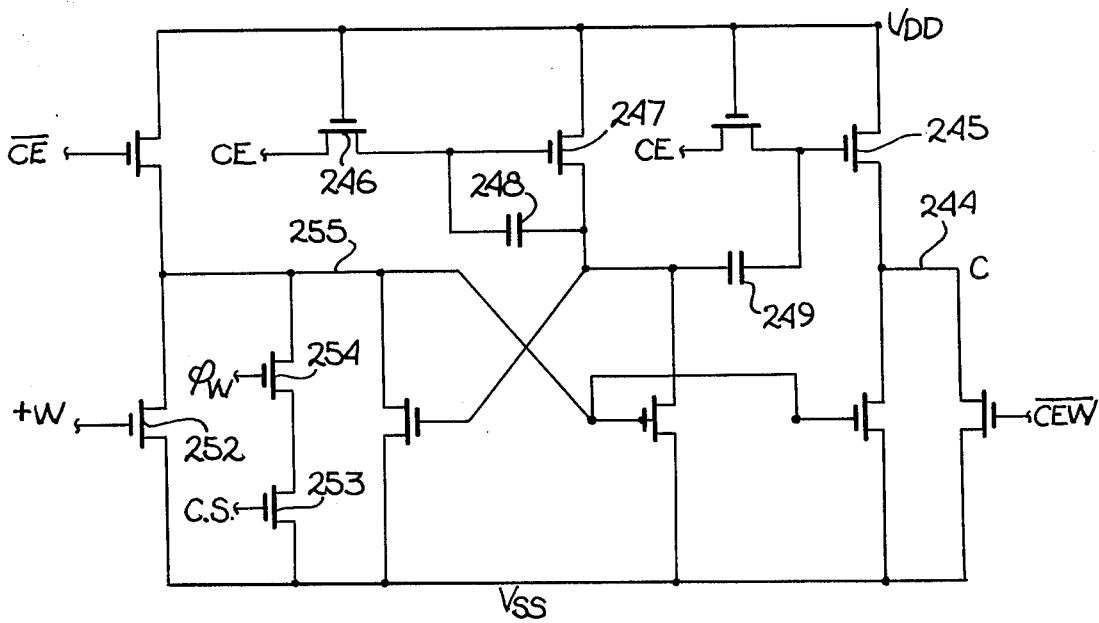
FIG. 10 is a circuit diagram of the C generator employed in the memory of FIG. 1.

In FIG. 10 the C generator is illustrated and includes an output node 244 which is coupled to $V_{DD}$ through an output transistor 245. The C generator is substantially the same as a $\phi_W$ generator, except that as previously mentioned, it is triggered by the $\phi_W$ signal. The output transistor 245 is bootstrapped in the same manner as the output transistor 240 of the $\phi_W$ generator (FIG. 9). The bootstrapping circuit includes transistors 246 and 247, and capacitors 248 and 249. Node 255 of the C generator which corresponds to node 225 of the $\phi_W$ generator is coupled to $V_{SS}$ through transistor 252, the gate of which is coupled to the source of the +W signal (buffer 38, FIG. 7). Also node 255 is coupled to $V_{SS}$ through the series combination of transistors 253 and 254. Transistor 253 has its gate coupled to the source of the C.S. signal while transistor 254 has its gate coupled to the source of the $\phi_W$ signal, node 222 of FIG. 9.

The output of the C generator couples the row select transistor, such as transistor 33 of FIG. 2, with the input/output bus 30. Transistor 253 assures that a C signal is only generated when a chip select signal has been received. Transistor 252 assures that a C signal exists when the write signal is present in order that information may be written onto the row lines. In all other respects though, the C generator operates in the same manner as the $\phi_W$ generator in FIG. 9. The output of the C generator will not occur until the $\phi_W$ signal has been generated, and then, the C signal will be delayed by a period of time determined by the circuitry of the C generator.

The O.S. generator 31 shown in FIG. 1 may be identical to, and is in fact identical, in the preferred embodiment to, the C generator or the $\phi_W$ generator except that it is activated or triggered by the output from the C generator, node 224 of FIG. 10. The O.S. generator also includes a transistor which is the equivalent of transistor 253 of FIG. 10 to assure that an output strobe signal is not generated unless a chip select signal is present.

Thus, a random access memory has been disclosed wherein each cell of the memory array includes a single transistor and a capacitor. The memory has been fabricated in a 4,096 bit array utilizing MOS technology.

We claim:

1. A random access memory comprising:
   a plurality of row lines, each row line including a right row line and a left row line;
   a plurality of column lines;
   a plurality of storage cells, each of said cells comprising a field effect transistor having a gate and a source and drain region, and a capacitive storage means, said gate being coupled to one of said column lines and one of said source and drain regions being coupled to one of said row lines;
   a plurality of sense amplifiers disposed in a column such that each of said sense amplifiers interconnects one of said right row lines with one of said left row lines of one of said rows;
   an input/output bus disposed along one end of said row lines and coupled to said row lines; and,
   a plurality of dummy cells, one coupled to each of said right row lines and each of said left row lines;
   whereby said input/output bus communicates with some of said storage cells through said sense amplifiers.

2. The memory defined in claim 1 wherein each of said capacitive storage means of said storage cells include an MOS device having its source and drain regions coupled together.

3. The memory defined in claim 2 wherein each of said dummy cells comprises a capacitive means having a substantially constant capacitance.

4. The memory defined in claim 3 wherein each of said sense amplifiers includes a bistable circuit coupled to one of said right row lines and one of said left row lines of one of said row lines.

5. The memory defined in claim 4 including at least three generator means for generating timing signals for said memory.

6. The memory defined in claim 5 wherein the output of said first generator means is used to initiate the generation of a signal in said second generator means and where the output of said second generator means is used to initiate the generation of a signal in said third generator means.

7. The memory defined in claim 6 including a plurality of address buffers for receiving an address and wherein said first generator means is coupled to at least one of said address buffers such that said first generator means initiates the generation of an output signal when said one of said buffers has sensed an address signal.

8. The memory defined in claim 4 including an output amplifier coupled to said input/output bus for sensing a signal on said bus and for providing an output signal.

9. The memory defined in claim 8 including positive feedback means for feeding back said output signal amplified, to said input/output bus.

10. The memory defined in claim 9 including a decoupling circuit for selectively decoupling said input/output bus from said output amplifier.

11. The memory defined in claim 4 wherein n-channel field effect transistors are employed in said memory.

12. The memory defined in claim 5 wherein said n-channel field effect transistors employ polycrystalline silicon gates.

13. In a memory employing a plurality of decoders wherein each of said decoders includes a plurality of field effect transistors coupled to a common node, said transistors being coupled to receive an address, and an output transistor having a gate and at least two terminals, one of said terminals being coupled to a source of potential, an improvement comprising:
   a decoupling transistor having a gate and two terminals, one of said terminals being coupled to said common node and the other of said terminals being coupled to said gate of said output transistor; and,
   circuit means coupled to the gate of said decoupling transistor for maintaining said gate of said decoupling transistor at the potential less than said potential applied to said one terminal of said output transistor;
   whereby more efficient decoupling is achieved between said gate of said output transistor and said common node.

14. The improvement defined in claim 13 wherein said circuit means coupled to the gate of said decoupling transistor includes a voltage dividing network comprising a pair of field effect transistors.

15. The improvement defined in claim 14 wherein the other terminal of said output transistor is coupled to the gate of said output transistor through a capacitor, said capacitor providing bootstrapping to said gate of said output transistor.

16. In a memory array including a bit sense line having a first segment and a second segment, and a bistable sense amplifier having a first node coupled to said first segment of said bit sense line and a second node coupled to said second segment of said bit sense line, said bistable sense amplifier including a pair of load means and a common node, the improvement comprising:
   a first timing means for applying a predetermined potential to said common node of said sense amplifier; and,
   a second timing means for activating said load means such that said load means change from a relatively high impedence to a lower impedence, said change in impedence being delayed in time from said application of said predetermined potential to said common node;
   whereby said sense amplifier has a relatively high gain when sensing charge on said bit sense line.

17. The improvement defined by claim 16 wherein said load means comprise a first and a second MOS transistor.

18. The improvement defined by claim 17 wherein said first MOS transistor is coupled between a source of power and said first node and said second MOS transistor is coupled between said source of power and said second node and the gates of said first and said second MOS transistors are coupled to a source of a first timing signal.

19. The improvement defined by claim 18 wherein said common node is coupled to said predetermined potential by a third MOS transistor, the gate of said third MOS transistor being coupled to said source of said first timing signal and wherein said delay in said change in impedance of said load means is obtained by precharging means for precharging said first and second nodes prior to the application of said first timing signal, thereby delaying the conduction of said first and said second MOS transistors.

* * * * *